US009622367B2

(12) United States Patent
Carter

(10) Patent No.: US 9,622,367 B2
(45) Date of Patent: Apr. 11, 2017

(54) SUBSEA CONNECTIONS

(71) Applicant: AKER SUBSEA LIMITED, Berkshire (GB)

(72) Inventor: Richard Hope Carter, Aberdeen (GB)

(73) Assignee: AKER SUBSEA LIMITED, Berkshire (GB)

( * ) Notice: Subject to any disclaimer, the term of this patent is extended or adjusted under 35 U.S.C. 154(b) by 303 days.

(21) Appl. No.: 14/277,364

(22) Filed: May 14, 2014

(65) Prior Publication Data

US 2014/0340852 A1   Nov. 20, 2014

(30) Foreign Application Priority Data

May 15, 2013 (GB) .................................. 1308733.3

(51) Int. Cl.
| | | |
|---|---|---|
| *H05K 7/00* | (2006.01) | |
| *E21B 33/035* | (2006.01) | |
| *E21B 33/038* | (2006.01) | |

(52) U.S. Cl.
CPC ........... *H05K 7/00* (2013.01); *E21B 33/0355* (2013.01); *E21B 33/0385* (2013.01)

(58) Field of Classification Search
CPC .... H05K 7/00; E21B 33/0355; E21B 33/0385
See application file for complete search history.

(56) References Cited

U.S. PATENT DOCUMENTS

| | | | | |
|---|---|---|---|---|
| 6,422,315 | B1 * | 7/2002 | Dean | E21B 33/038 166/339 |
| 6,595,487 | B2 * | 7/2003 | Johansen | F16K 31/04 251/129.04 |
| 6,998,724 | B2 * | 2/2006 | Johansen | E21B 33/0355 166/65.1 |
| 7,757,772 | B2 * | 7/2010 | Donohue | E21B 33/0355 166/338 |
| 7,992,633 | B2 * | 8/2011 | Donald | E21B 33/03 166/105 |
| 8,066,076 | B2 * | 11/2011 | Donald | E21B 33/035 166/344 |
| 8,297,360 | B2 * | 10/2012 | Donald | E21B 33/035 166/364 |

(Continued)

FOREIGN PATENT DOCUMENTS

WO   WO2007/016678   2/2007

OTHER PUBLICATIONS

Search Report dated Oct. 31, 2013 in GB 1308733.3.

(Continued)

*Primary Examiner* — David M Sinclair
*Assistant Examiner* — Robert Brown
(74) *Attorney, Agent, or Firm* — Nixon & Vanderhye P.C.

(57) ABSTRACT

An assembly of subsea equipment and a plurality of subsea devices each of which is individually mountable on and separable from the subsea equipment wherein each device includes a respective stab connector for establishing electrical connection with the equipment and further has a respective terminal connector for a jumper lead, each device having at least dual redundancy whereby connection through the respective jumper terminal can substitute for the connection though the respective stab connector.

3 Claims, 1 Drawing Sheet

(56) References Cited

U.S. PATENT DOCUMENTS

| | | | | | |
|---|---|---|---|---|---|
| 8,353,350 | B2* | 1/2013 | Overfield | ............ | E21B 33/0385 166/250.01 |
| 8,376,051 | B2* | 2/2013 | McGrath | ................. | E21B 33/06 166/344 |
| 8,403,053 | B2* | 3/2013 | Judge | .................. | E21B 33/0355 166/250.01 |
| 8,485,260 | B2* | 7/2013 | Donohue | ............ | E21B 33/0355 137/884 |
| 8,490,705 | B2* | 7/2013 | Curtiss, III | ............. | E21B 34/16 166/250.1 |
| 8,727,013 | B2* | 5/2014 | Buckley | .............. | E21B 33/0355 166/338 |
| 9,038,727 | B2* | 5/2015 | Bisset | ................... | E21B 33/035 166/344 |
| 9,291,020 | B2* | 3/2016 | McWhorter | .......... | E21B 33/064 |
| 2003/0042025 | A1* | 3/2003 | Fenton | ................. | E21B 33/035 166/347 |
| 2004/0216884 | A1* | 11/2004 | Bodine | ............... | E21B 33/0355 166/335 |
| 2005/0039923 | A1* | 2/2005 | Howe | ................. | E21B 33/0355 166/368 |
| 2005/0232145 | A1* | 10/2005 | Tanju | ....................... | G05B 9/03 370/217 |
| 2009/0101350 | A1* | 4/2009 | O'leary | ............... | E21B 33/0355 166/344 |
| 2010/0127566 | A1* | 5/2010 | Biester | ................ | E21B 33/0355 307/18 |
| 2012/0139511 | A1* | 6/2012 | Chou | ..................... | H01R 29/00 323/267 |
| 2012/0186820 | A1* | 7/2012 | Donahue | ............. | E21B 33/0355 166/344 |

OTHER PUBLICATIONS

International Search Report mailed Sep. 2, 2014 in PCT/GB2014/051485.

Vidar Sten-Halvorsen FMC Technologies et al., "All Electric Subsea Tree System," Offshore Technology Conference, No. OTC 19547, May 5, 2008, XP007920076.

Deutsch Offshore: "D53001 series, Contact signal connectors, ROV, Stab-Plate, & Diver wet mateable," Aug. 1, 2010, XP055134991; retrieved from the internet: URL: http://www.te.com/content/dam/te/global/english/tradeshow/2013/sstb/ds3001-brochure-aug10.pdf.

Vidar Sten-Halvorsen et al., "Long Distance Challenges—Control Systems," Feb. 28, 2008, XP055134983; retrieved from the internet: URL:http://www.betong.net/ikbViewer/Content/34635/1340 %20Vidar%20Sten-Halvorsen%20ver2.pdf.

Alf-Kristian Aadland et al., "Subsea All electric," Jun. 3, 2010, XP055135118, retrieved from the internet: URL:https://www.onepetro.org/conference-paper/SUT-SCADA-10-05.

* cited by examiner

SUBSEA CONNECTIONS

This application claims priority to GB Application No. 1308733.3 filed on May 15, 2013, the entire content of which is hereby incorporated by reference.

FIELD OF THE INVENTION

This invention concerns the electrical connection of subsea equipment which is retrievable to subsea structures such as trees and manifolds.

INTRODUCTION

It is now commonplace to provide various items of subsea equipment in the form of sealed units which can be individually retrieved from the main structure, such as a manifold, tree or other device with which it cooperates in use. The facility is particularly useful for such items as electrical actuators for valves and/or power supply units, which receive electrical power in one form (such as direct current at a particular voltage) and convert the electrical power into a form and/or voltage level suitable for the main structure or device.

Retrievable subsea equipment with electrical connections is typically connected by means of one of two techniques. The equipment may have 'stab' connections that mate with connectors on a mounting base during installation. Alternatively the equipment may have 'jumper' or 'flying' leads that have a connector at one end or both ends. These connections are usually made up after the equipment has been properly located in position.

Stab-type connections allow mating to be completed as part of the installation of the item on the main equipment. Wiring and cabling can be organized and arranged to avoid danger of damage during the installation if the item, which often has to be performed by a ROV. However, stab connections often require special tooling to ensure that sufficient force is applied to make the connections, especially if there are multiple connections that have to made at the same time. Moreover, if there be a failure in the associated cabling or a connector, it cannot easily be individually changed.

Jumper connections allow jumpers that fail (typically owing to the ingress of water) to be replaced without the need to retrieve the equipment. If a connector on the retrievable item fails, the item may be retrieved and changed. However, where many connections are required the handling of them by a ROV and the organization of the jumpers may well become difficult or complex.

SUMMARY

The present example embodiment concerns the use of both types of connection for retrievable equipment, such that the stab connections and the jumper connections provide dual redundancy. The invention is applicable to retrievable electrical actuators but has utility in relation to other retrievable items.

The example embodiment provides an assembly comprising subsea equipment and a plurality of subsea devices each comprising an electrical actuator, each of which devices is individually mountable on and separable from the subsea equipment and includes a respective stab connector for establishing electrical connection with the equipment and further has a respective terminal connector for a jumper lead, each device having at least dual redundancy whereby connection through the respective jumper terminal can substitute for the connection through the respective stab connector; and in which the assembly includes a control module which can communicate with each of the said devices by way of the stab connections thereof and includes a terminal for at least one jumper lead for establishing a substitute connection to at least one of the said devices.

The control module may be mountable on and separable from the subsea equipment and include a stab connector for establishing electrical connection with the equipment.

There is herein described a subsea device which is individually mountable on and separable from operationally associated fixed subsea equipment and includes a stab connector for establishing electrical connection with the equipment and further has a terminal connector for a jumper lead, the device having at least dual redundancy whereby connection through the jumper terminal can substitute for the connection though the stab connector.

There is also herein described an assembly comprising subsea equipment and a plurality of subsea devices each of which is individually mountable on and separable from the subsea equipment and includes a respective stab connector for establishing electrical connection with the equipment and further has a respective terminal connector for a jumper lead, each device having at least dual redundancy whereby connection through the respective jumper terminal can substitute for the connection though the respective stab connector.

The assembly may include a control module which can communicate with each of the said devices by way of the stab connections thereof and includes a terminal for at least one jumper lead for establishing a substitute connection to at least one of the said devices.

The control module may be mountable on and separable from the subsea equipment and include a stab connector for establishing electrical connection with the equipment.

There follows a description of one embodiment of the invention by way of example and with reference to the accompanying drawings.

DETAILED DESCRIPTION

Figure 1:
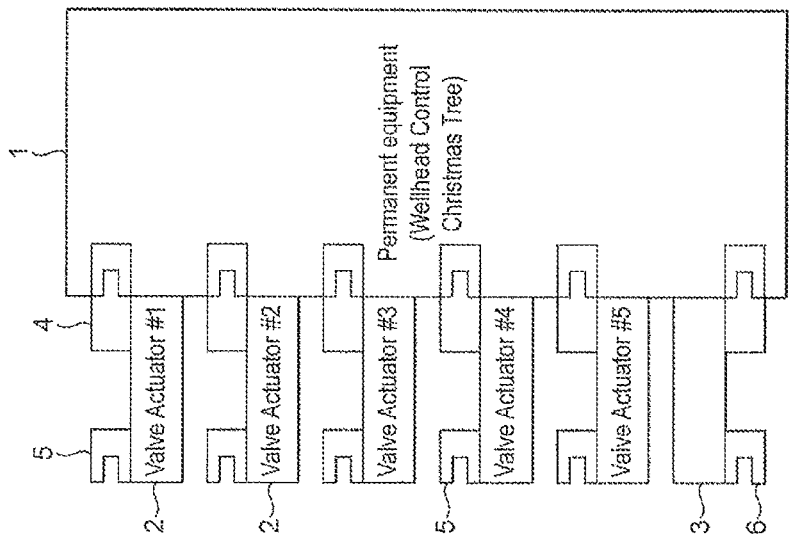
FIG. 1 illustrates schematically a multiplicity of retrievable items in place on permanent equipment.

FIG. 1 illustrates a one exemplary embodiment of the invention, and shows schematically a subsea structure 1 which is substantially permanent in the sense that it is intended to remain in situ for an extended period such as the lifetime of a subsea well. The structure 1 may be a wellhead, a tree, a control module, a manifold or other structure.

Attached to the structure 1 are retrievable devices. In this example they comprise a plurality of electric actuators 2 and a control module 3. In other dispositions at least one could be a power supply module. These devices can be individually removed and replaced. In the present example it is presumed that the module 3 can control each of the actuators 2 in accordance with commands directed to it from the structure 1.

Each of the items 2 and 3 is shown with a respective one of the stab connections 4 so that the module 3 is connected to circuits within the structure and so that each of the actuators 2 is connected for control by way of wiring or cabling within the fixed structure 1 to the control module 3.

Each of the actuators has dual redundancy so that it can be operated not only by way of the stab connection but alternatively by way of a respective jumper terminal 5. Actuators which are adaptable for such dual inputs are for example described in our international patent application No. PCT/GB2012/000225.

In normal circumstances each actuator is driven by way of its stab connection.

Figure 2:
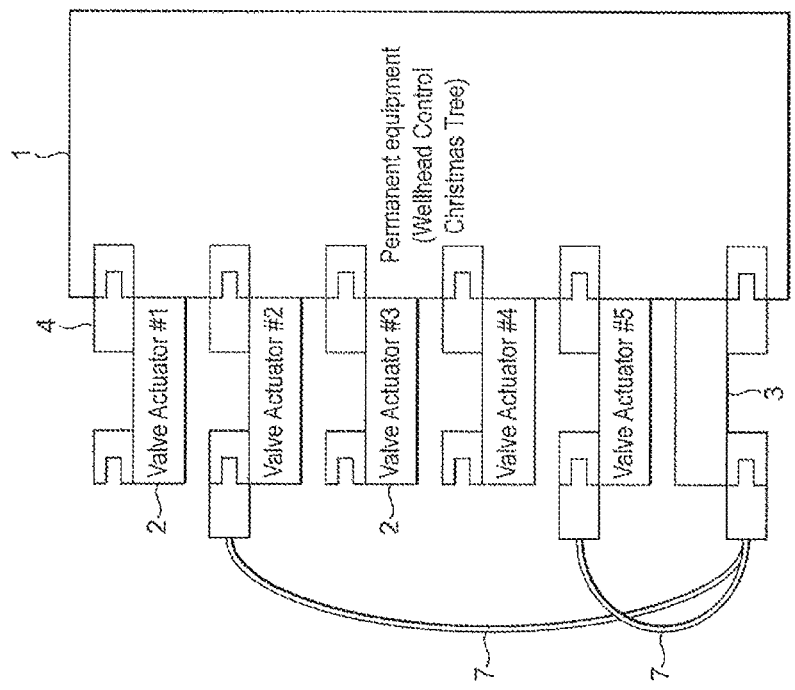
FIG. 2 is similar to FIG. 1 but further illustrates the use of jumper leads.

The module 3 has a jumper terminal 6. This may be a terminal for a single jumper lead but may be capable of use with a plurality of jumper leads. Thereby the module can be connected as shown in FIG. 2 to one or more of the actuators in the event of, for example, failure of the stab connection or wiring associated with the respective actuator. FIG. 2 shows jumper leads 7 from the module 3 to the second and fifth actuators.

The communication between the electronics control module and the actuators may be Ethernet or other suitable communication format.

The invention claimed is:

1. An assembly comprising:
    subsea equipment and a plurality of subsea electrical actuator devices each comprising an electrical actuator,
    each of which electrical actuator devices is individually mountable on and separable from the subsea equipment and includes a respective stab connector for establishing electrical connection with internal circuits of the subsea equipment and further has a respective terminal connector for a jumper lead to internal circuits of the electrical actuator device,
    each said electrical actuator device having at least dual redundancy whereby connection to a control module through the respective jumper terminal can substitute for the connection to a control module through the respective stab connector and internal circuits of said subsea equipment; and
    wherein the assembly includes a control module which can communicate with each of the said electrical actuator devices by way of the stab connections thereof and includes a terminal for at least one jumper lead for establishing a failsafe substitute connection to at least one of the said electrical actuator devices if a failure occurs in a connection between the electrical actuator device and said control module via said internal circuits of said subsea equipment.

2. An assembly according to claim 1 in which the control module is mountable on and separable from the subsea equipment and includes a stab connector for establishing electrical connection with the subsea equipment.

3. An assembly comprising:
    a subsea structure having internal circuits connectable to externally mountable modules;
    a plurality of modular subsea devices which are individually mountable on and separable from said subsea structure;
    each said subsea device having a stab electrical connector configured to connect internal module circuits to circuits within the subsea structure;
    each said subsea device also having an external terminal connector for a jumper lead, said terminal connector being connected to the internal module circuits of that modular subsea device;
    at least one of said modular subsea devices comprising a control module having internal module circuits that include control circuits configured to communicate with and control a plurality of other of said modular subsea devices by way of either (a) the external terminal connector of another modular subsea device or (b) the stab connector of the other module via said internal circuits within the subsea structure;
    wherein the stab connector and external terminal connector provide fails redundancy for connection between said control circuits and actuator circuits internal to other of said modular subsea devices if failure occurs in a connection there-between made via said internal circuits of the subsea structure.

* * * * *